United States Patent
Nakakura et al.

(10) Patent No.: US 6,860,005 B2
(45) Date of Patent: Mar. 1, 2005

(54) METHOD OF FABRICATING PRINTED CIRCUIT BOARD

(75) Inventors: Toshihiro Nakakura, Takefu (JP); Takayuki Kado, Takefu (JP); Masaki Terada, Takefu (JP); Takashi Tokuda, Takefu (JP)

(73) Assignee: Orion Electric Company, Ltd., Fukui-ken (JP)

( * ) Notice: Subject to any disclaimer, the term of this patent is extended or adjusted under 35 U.S.C. 154(b) by 0 days.

(21) Appl. No.: 10/735,878

(22) Filed: Dec. 16, 2003

(65) Prior Publication Data

US 2004/0123454 A1 Jul. 1, 2004

(30) Foreign Application Priority Data

Dec. 17, 2002 (JP) .......................................... 2002-365651

(51) Int. Cl.[7] .................................................. H05K 3/30
(52) U.S. Cl. ............................. 29/832; 29/740; 29/840
(58) Field of Search ........................... 29/740, 832, 834, 29/840

(56) References Cited

U.S. PATENT DOCUMENTS

| | | | | |
|---|---|---|---|---|
| 4,127,432 A | * | 11/1978 | Kuwano et al. ............. | 156/297 |
| 4,292,116 A | * | 9/1981 | Takahashi et al. ........... | 156/566 |
| 4,375,126 A | * | 3/1983 | Dull et al. ..................... | 29/740 |
| 4,389,272 A | * | 6/1983 | Ferri et al. ................... | 156/297 |
| 4,868,979 A | * | 9/1989 | Fukushima et al. ........... | 29/840 |

FOREIGN PATENT DOCUMENTS

| | | | |
|---|---|---|---|
| EP | 0329004 | * | 8/1989 |
| JP | 05-021909 | | 7/1991 |

* cited by examiner

*Primary Examiner*—Carl J. Arbes
(74) *Attorney, Agent, or Firm*—Reed Smith LLP; Stanley P. Fisher, Esq.; Juan Carlos A. Marquez, Esq.

(57) ABSTRACT

A method of fabricating a printed circuit board efficiently within a short time is disclosed. Two areas R1 and R2 to fabricate two printed circuit boards are assigned to a single original board 5 from which a plurality of boards are available. A first automatic mounting area 1 where the chip parts are mounted to obtain one printed circuit board is set in the area R1. A second automatic mounting area 2 where the chip parts are mounted to obtain another printed circuit board is set in the area R2. An automatic mounting range 3, including the two automatic mounting areas 1 and 2, is set in a predetermined range of the original board 5 in such a manner as to correspond to the range where the chip parts mounter carries out the work of mounting the chip parts.

16 Claims, 16 Drawing Sheets

[Fig. 1]
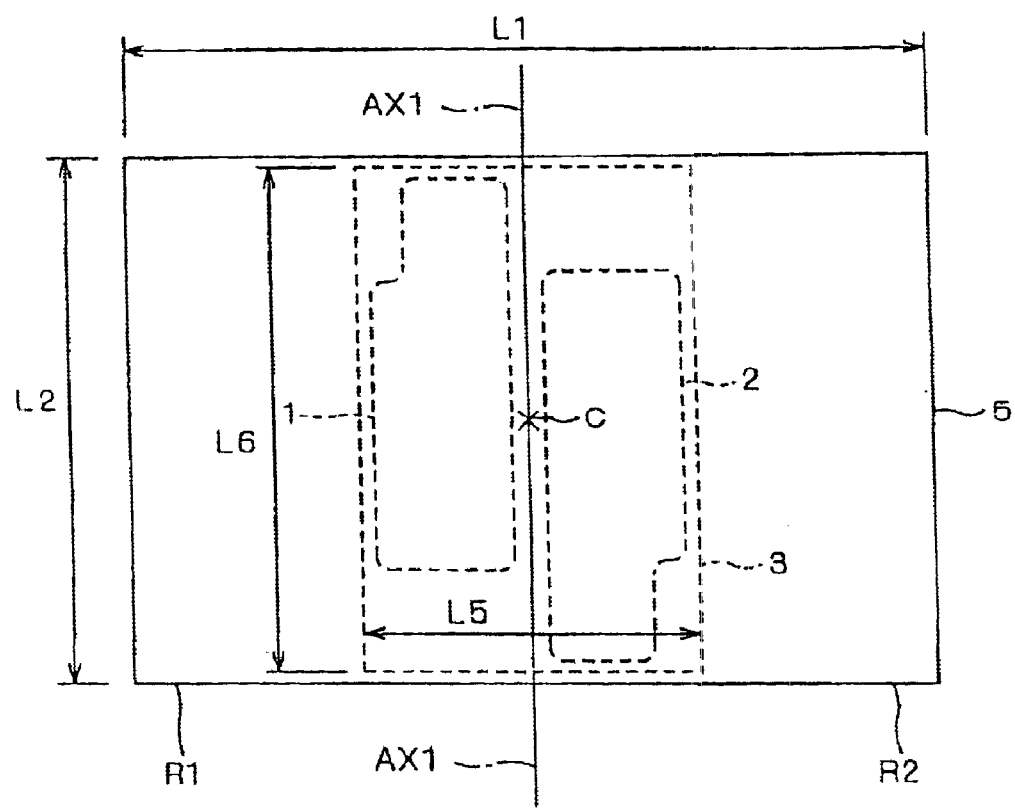

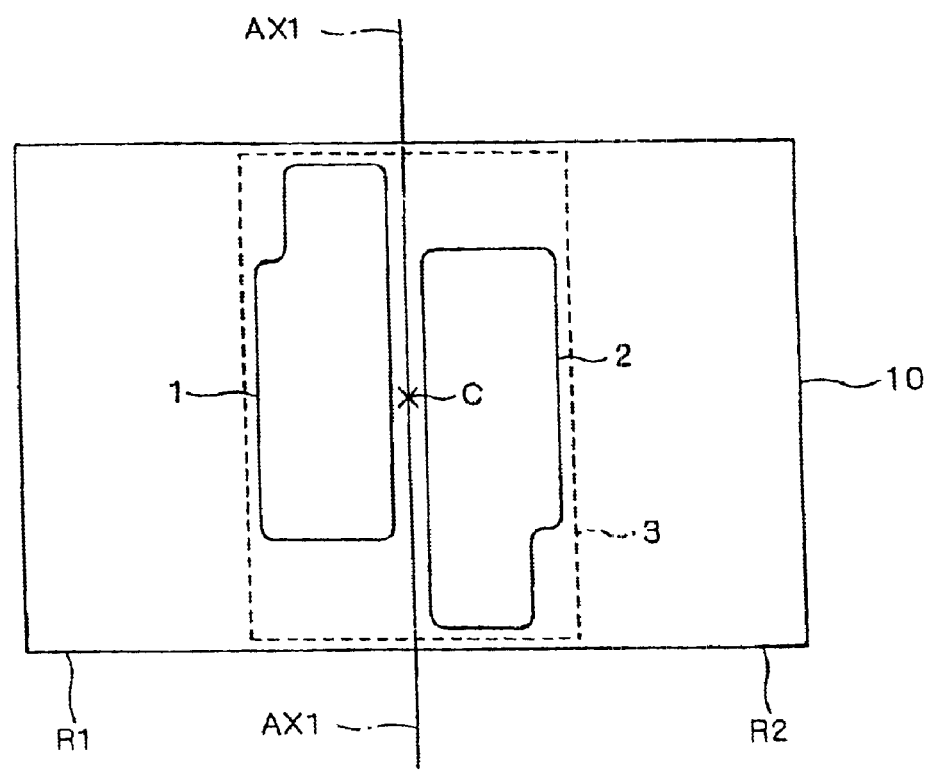
[Fig. 2]

[Fig. 3]
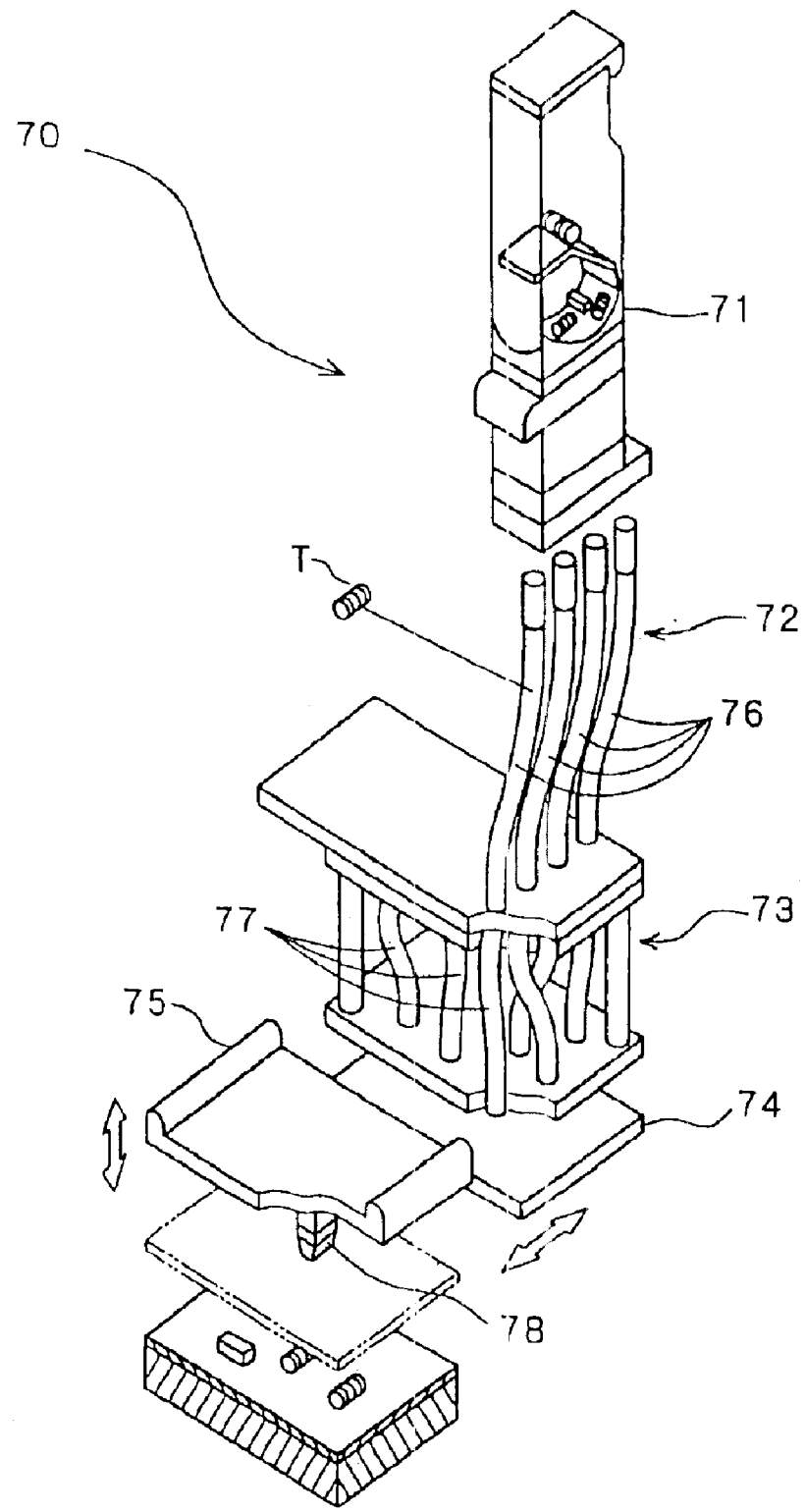

[Fig. 4]
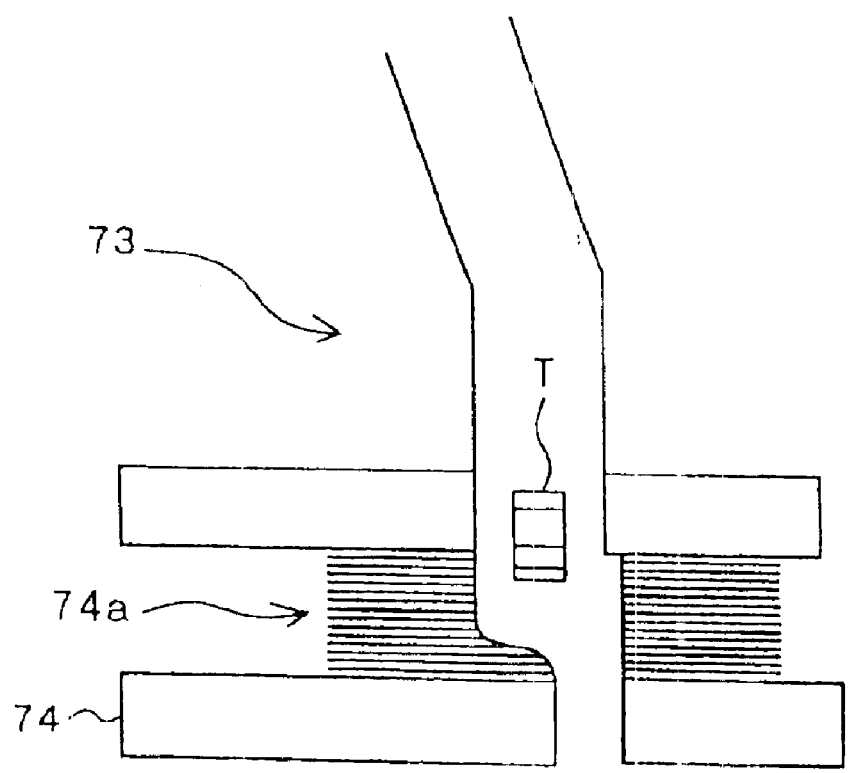

[Fig. 5]
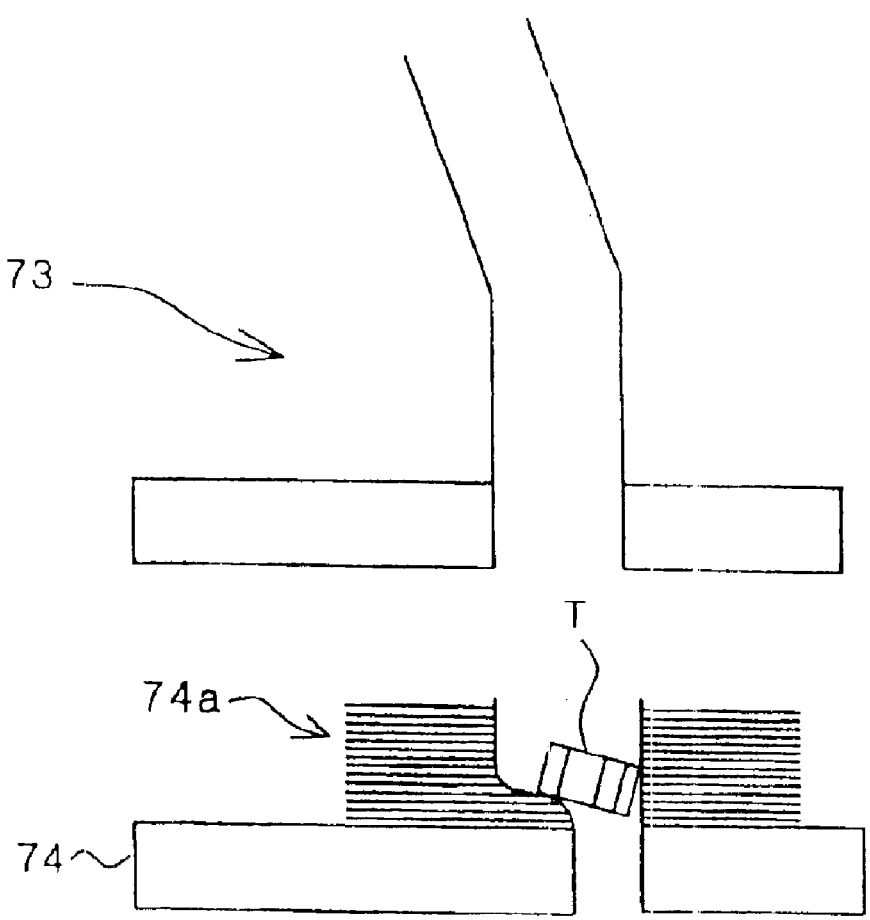

[Fig. 6]
(a)
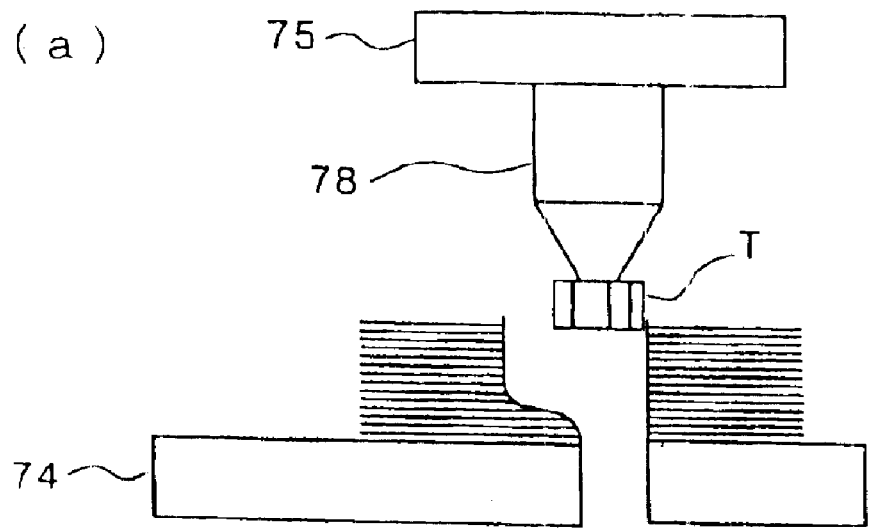
(b)
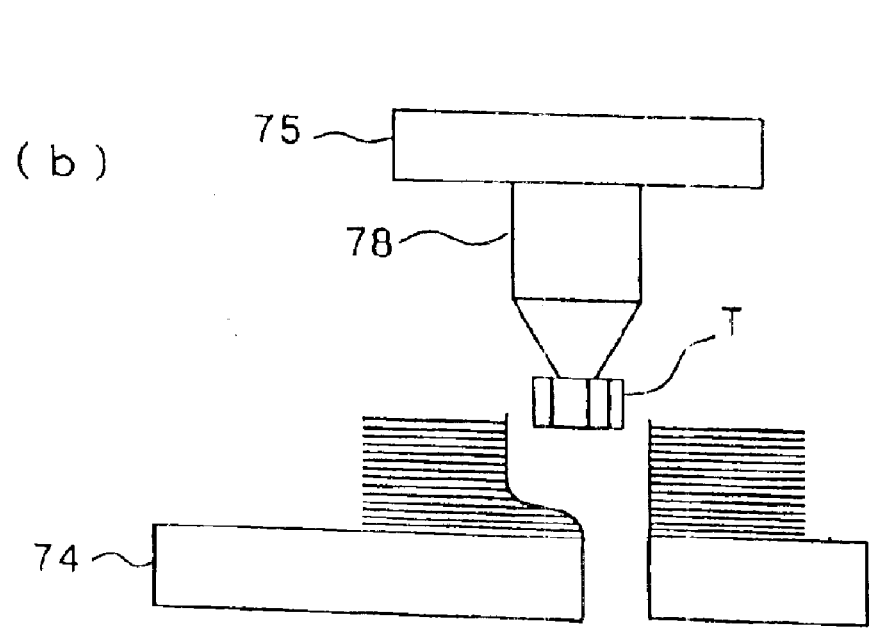

[Fig. 7]
(a)
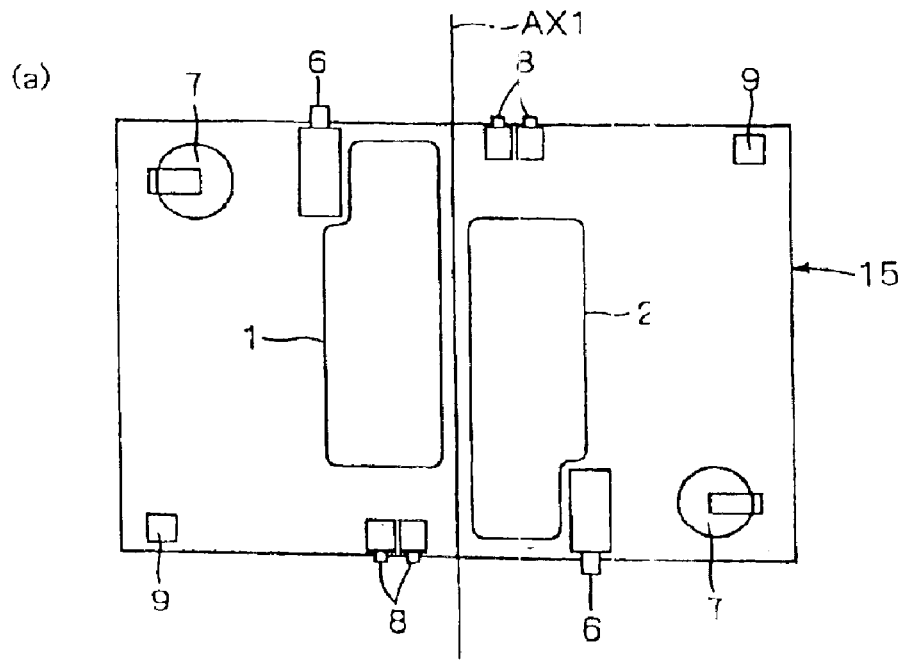
(b)
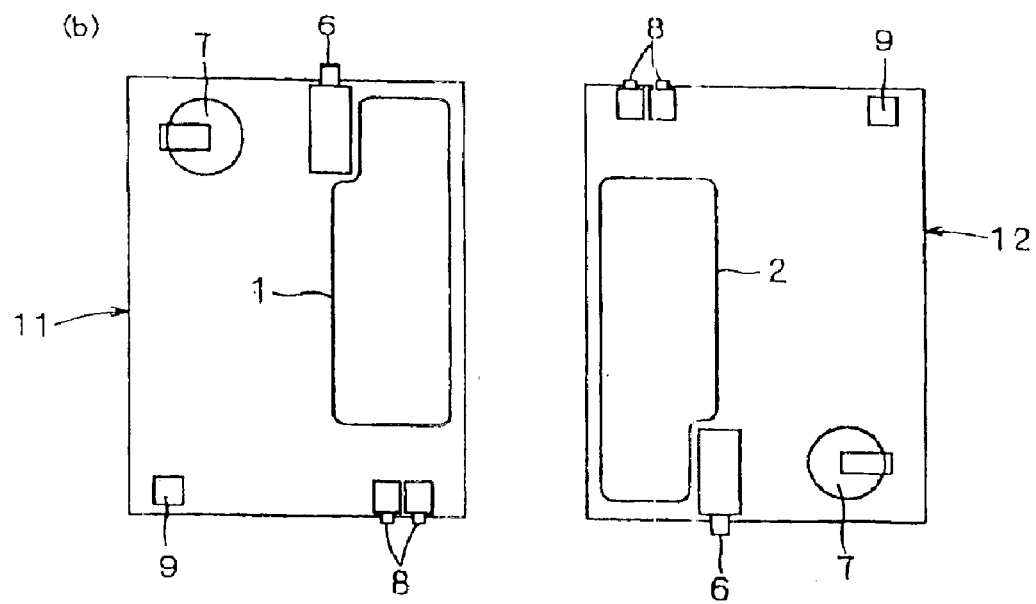

[Fig. 8]
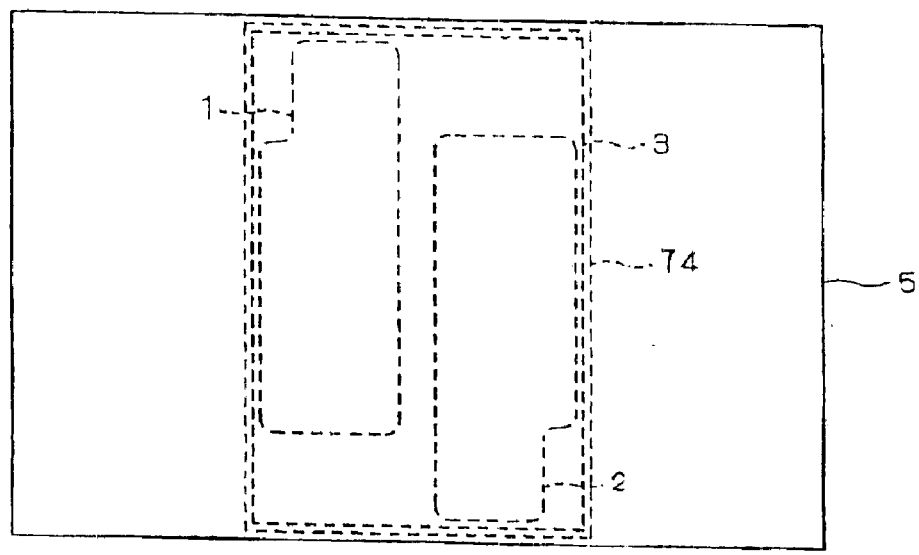
[Fig. 9]
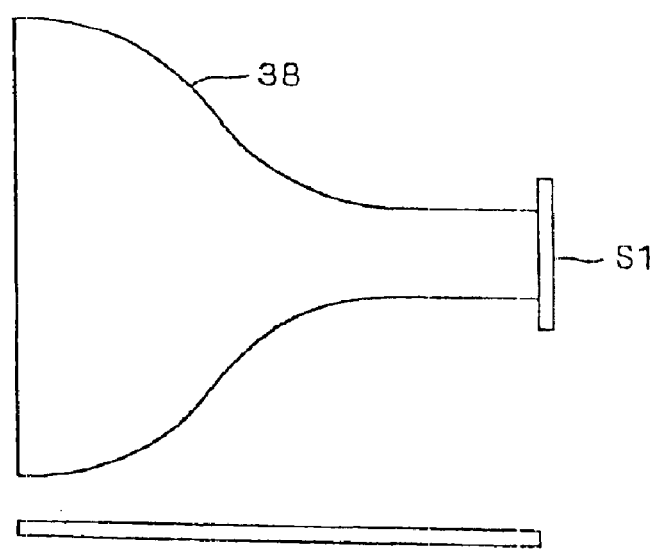

[Fig. 10]
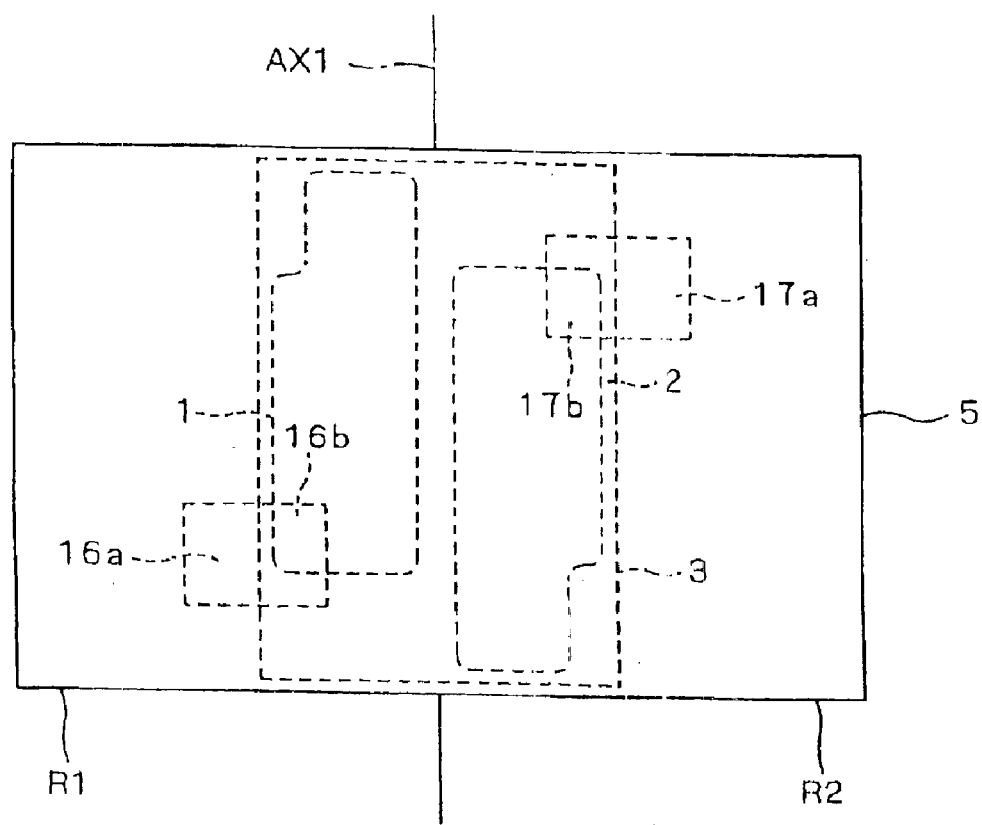

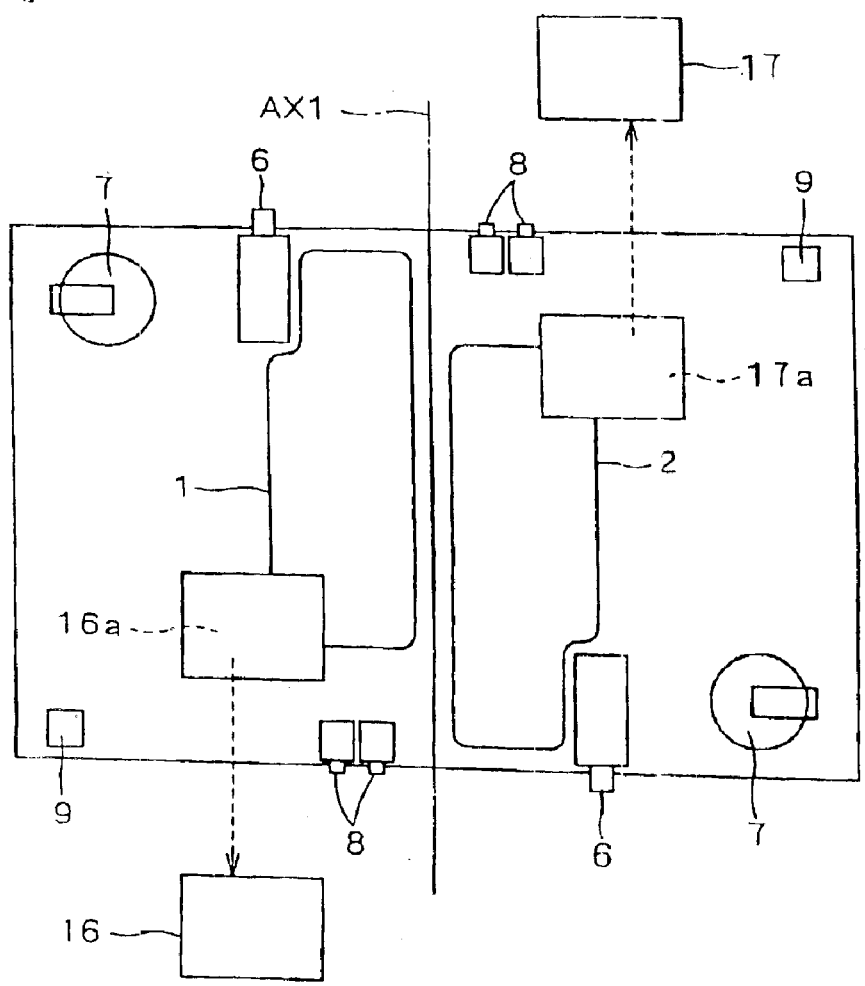
[Fig. 11]

[Fig. 12]
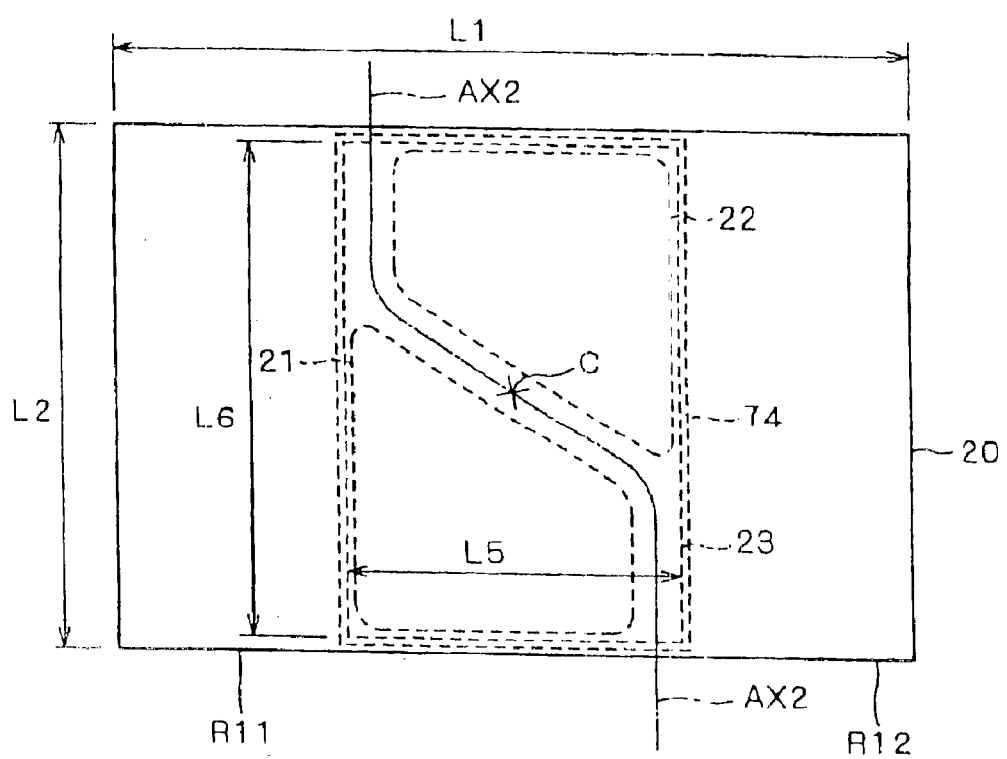

[Fig. 13]
(a)
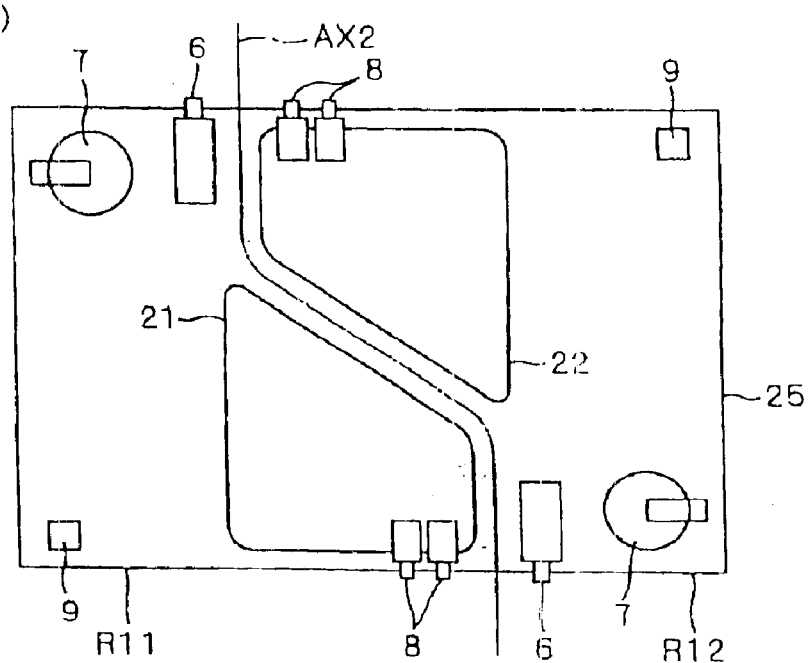
(b)
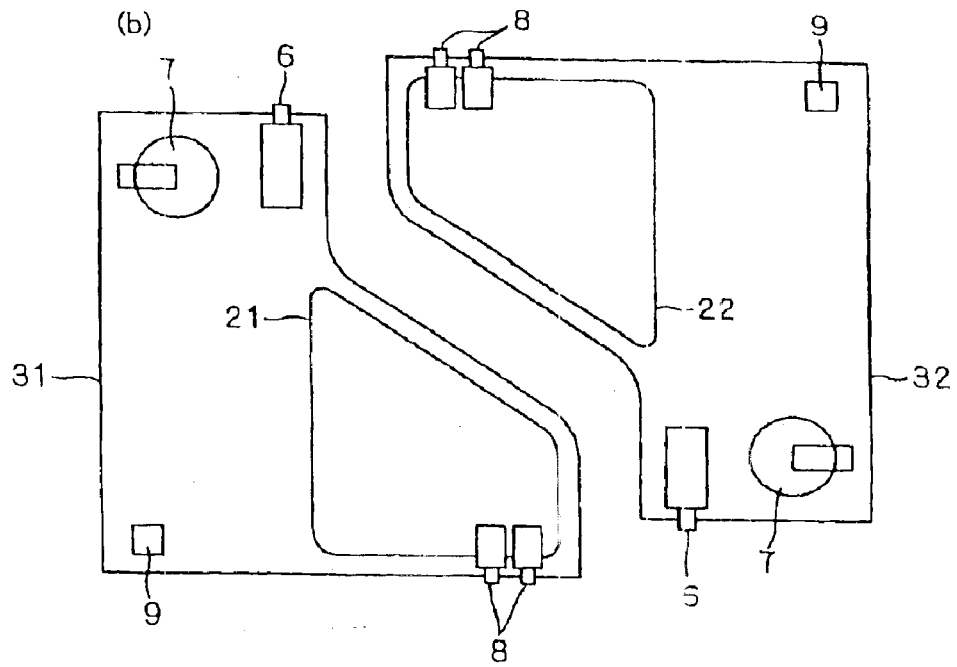

[Fig. 14]
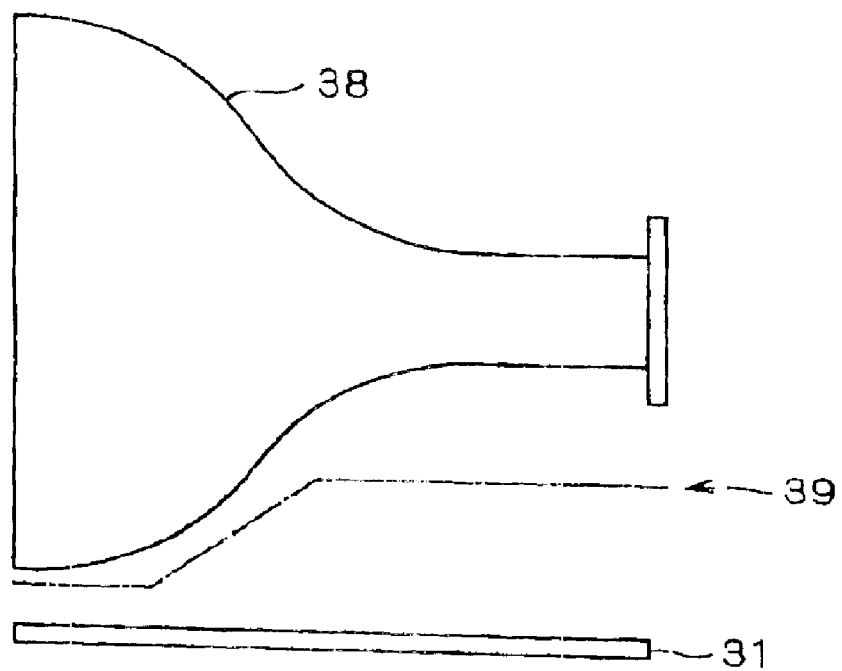

[Fig. 15]
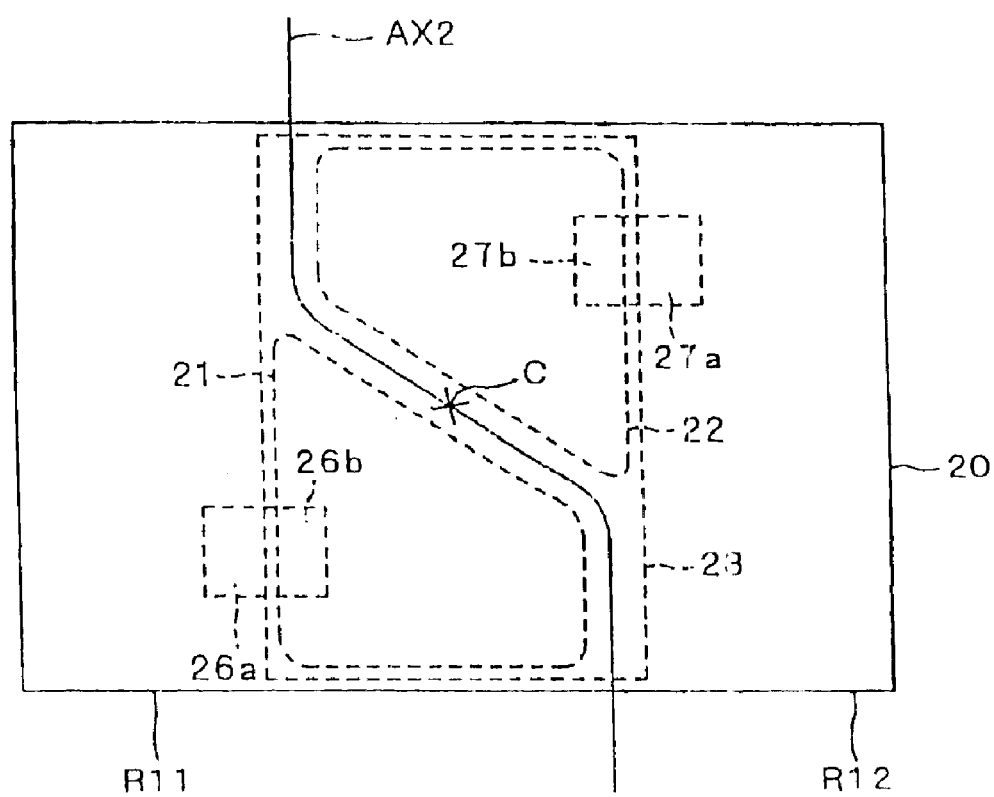

[Fig. 16]
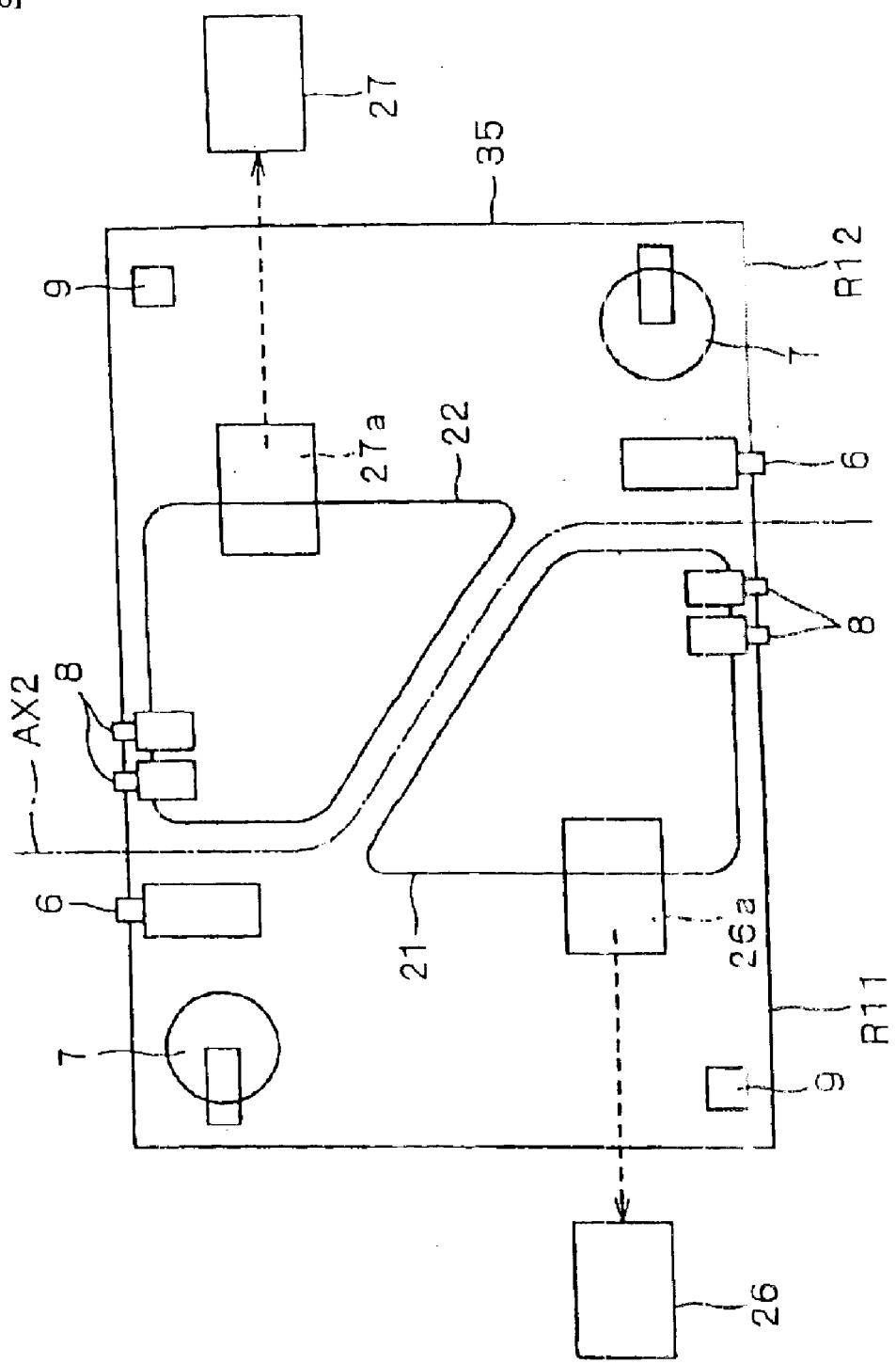

[Fig. 17]
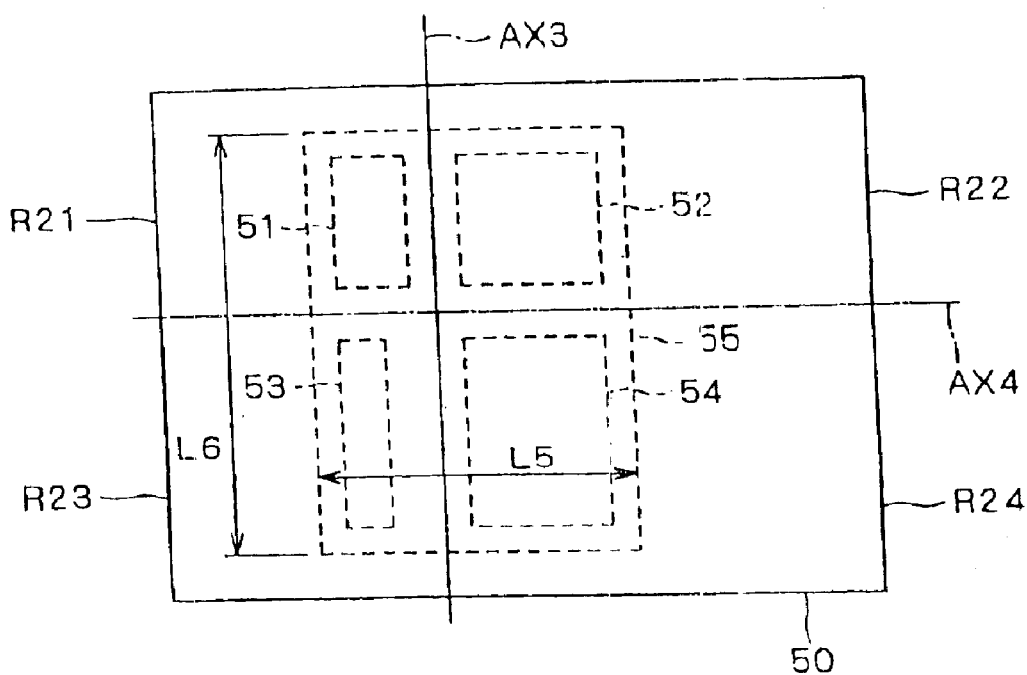

METHOD OF FABRICATING PRINTED CIRCUIT BOARD

BACKGROUND OF THE INVENTION

1. Field of the Invention

The present invention relates to a method of fabricating a printed circuit board.

2. Description of the Related Art

A printed circuit board carrying electronic parts on a printed board is widely used for electric appliances. In determining the layout of the electronic parts on the printed board, the CAD software is generally used as a design means.

The designing process using the CAD software includes the steps of inputting a profile, selecting parts, arranging parts and wiring. In these steps of inputting a profile, selecting parts and arranging the parts, the size of the printed board and the range in which the parts are mounted are determined by taking into account the specifications and the performance of the device for mounting the parts in addition to the structure of the products and the number, type and the shape of the parts used.

Also, the height limit of the parts is determined by taking into consideration the convenience of incorporating the printed circuit board in the product housing. Based on the data obtained from the steps of inputting the profile, selecting the parts, arranging the parts and wiring described above, the wiring pattern and the layout of the parts on the printed board are determined.

The wiring pattern thus determined is formed actually on a board thereby to form a printed wiring board. Further, a printed circuit board is fabricated through the step of mounting the parts on the printed wiring board and the step of soldering the terminals of the parts and the wiring pattern to each other.

Also, in the step of mounting the parts, a device for automatically mounting the parts is used to improve the production efficiency. Further, in order to improve the efficiency of mounting the parts, a plurality of boards used for a plurality of printed circuit boards are assigned to a single original board from which a plurality of boards are obtainable.

A conventional method is disclosed in Japanese Patent Application Laid-Open No. 5-21909.

According to the prior art, however, the job of chip parts mounter to mount the parts cannot be further improved in efficiency. Also, the cost of the printed circuit board cannot be further reduced.

SUMMARY OF THE INVENTION

Accordingly, it is an object of this invention to a method of fabricating a printed circuit board in which the job of mounting the surface mount parts is conducted more efficiently by the chip parts mounter thereby to further improve the efficiency of forming the printed circuit board and thereby to further reduce the cost of the printed circuit board.

In order to solve the problems described above, according to a first aspect of this invention, there is provided a method of fabricating a printed circuit board, comprising:

a mounting range setting step wherein a plurality of areas each used as a base board of a printed circuit board are assigned to a single original board from which a plurality of printed circuit boards are obtainable, an automatic mounting area is set in each of the areas for a chip parts mounter to mount surface mount parts for forming a printed circuit board corresponding to each of the areas assigned for the base board of each of the printed circuit boards, and an automatic mounting range is set in a range covering all the automatic mounting areas in each area where the base board of each of the printed circuit boards is assigned;

wherein the mounting range setting step is such that the automatic mounting range is set within a predetermined range on the single original board and within which the chip parts mounter can mount the surface mount parts.

In this aspect of the invention, an automatic mounting area for each of a plurality of printed circuit boards is set on an original board for fabricating a plurality of the printed circuit boards, and an automatic mounting range is set for the chip parts mounter to conduct the work of mounting the surface mount parts in a range covering all the automatic mounting areas.

The automatic mounting range is set within a range where the chip parts mounter can mount the surface mount parts. As a result, in the subsequent step of mounting the surface mount parts by the chip parts mounter, the job of mounting the surface mount parts can be conducted in all of a plurality of the automatic mounting areas set on the original board.

Therefore, the surface mount parts to fabricate a plurality of printed circuit boards on a single board can be mounted efficiently within a short time. In this way, the printed circuit board can be efficiently fabricated within a short time and the cost can be reduced.

The surface mount parts are defined as those electronic parts mounted on the printed board of which the surface where the parts are mounted coincides with the surface where the terminals are soldered. The surface mount parts include a square chip part, a cylindrical chip part, a comparatively large square chip part and an IC (integrated circuit).

According to a second aspect of the invention, there is provided a method of fabricating a printed circuit board, wherein the surface mount parts are chip parts, wherein the chip parts mounter is of multiple type for collectively mounting the chip parts by positioning each of the chip parts with a template of a specified size, and wherein the template of the specified size is smaller than the original board, and the automatic mounting range is set to correspond to the range of the template of the specified size.

In the step of mounting the chip parts by the chip parts mounter, the chip parts can be mounted collectively in a plurality of the automatic mounting areas by positioning the chip parts with the template. More desirably, therefore, the chip parts can be mounted efficiently within a shorter length of time.

Also, a compact chip parts mounter with a template smaller than the original board can be used in the step of mounting the chip parts. As a result, the acquisition cost of the chip parts mounter is reduced for a lower cost of the printed circuit board.

According to a third aspect of the invention, there is provided a method of fabricating a printed circuit board, wherein in the case where the chip parts are mounted using the chip parts mounter based on the multiple method as in the second aspect described above, the printed circuit board is used as a main circuit board of a TV receiver, wherein in the mounting range setting step, a first area and a second area to form a base board of the main circuit board are equally assigned to the original printed board, and an automatic mounting area is set in each of the first and second areas, and wherein the first and second areas can be so assigned that one of the first and second areas, if rotated by 180 degrees around the center of the original board, comes to coincide with the other.

In this aspect of the invention, a printed circuit board used as the main circuit board of the TV receiver can be fabricated. Also, in this aspect of the invention, two main circuit boards can be formed efficiently from a single original board at a reduced cost.

In fabricating a printed circuit board used as the main circuit board of the TV receiver as described in the third aspect above, the CRT circuit board of the TV receiver can also be obtained from the single original board. The base board of this CRT circuit board is smaller in size than the base board of the main circuit board.

According to a fourth aspect of the invention, there is provided a method of fabricating a printed circuit board, comprising the step of setting a mounting range, wherein an area used as a base board of the CRT circuit board is set in each of that portion of the first area where the parts are not formed on the main circuit board and that portion of the second area where the parts are not formed on the main circuit board, wherein a CRT circuit board mounting area for mounting the chip parts to form the CRT circuit board is set in each of the areas used as the base board of the CRT circuit board, and wherein the automatic mounting range is set to include the two CRT circuit board mounting areas.

In this invention, the CRT circuit board mounting area is set in each of the first area and the second area. The automatic mounting range is set to cover the two CRT circuit board mounting areas.

Also, according to this aspect of the invention, the step of mounting the chip parts by the chip parts mounter of multiple type is such that all the chip parts for forming the two main circuit boards and all the chip parts for forming the two CRT circuit boards can be mounted collectively within the automatic mounting range.

As a result, the two main circuit boards and the two CRT circuit boards can be efficiently fabricated and thereby the fabrication cost is reduced.

According to a fifth aspect of the invention, there is provided a method of fabricating a printed circuit board, wherein in the case where the automatic mounting range is set as a range for mounting the surface mount parts as in the first aspect of the invention, the method further comprises the step of mounting the surface mount parts by the chip parts mounter in the automatic mounting range set in the mounting range setting step.

As a result, the surface mount parts can be mounted by the chip parts mounter on a board with the automatic mounting range set thereon, and a printed circuit board can thus be fabricated. According to this aspect of the invention, the surface mount parts can be mounted within a short time, thereby making it possible to fabricate a printed circuit board more efficiently.

According to a sixth aspect of the invention, there is provided a method of fabricating a printed circuit board, wherein in the case where the automatic mounting range is set as a range for mounting the chip parts as in the second to fourth aspects of the invention, the method further comprises the step of mounting the chip parts by the chip parts mounter of multiple type in the automatic mounting range set in the mounting range setting step.

As a result, the chip parts are mounted by the chip parts mounter of multiple type on a board with the automatic mounting range set thereon, and a printed circuit board can thus be fabricated. Also, according to this aspect of the invention, the chip parts can be mounted within a short time, thereby making it possible to fabricate a printed circuit board more efficiently.

BRIEF DESCRIPTION OF THE DRAWINGS

FIG. 1 shows an example of an original board with automatic mounting areas and an automatic mounting range set thereon;

FIG. 2 shows a printed board after a wiring pattern is formed;

FIG. 3 is a perspective view of a chip parts mounter (multi-mounter);

FIG. 4 is a view showing a manner in which a chip part is led by a metal template;

FIG. 5 is a view showing a manner in which a chip part is set in a predetermined position of the metal template;

FIGS. 6A and 6B are views showing a manner in which the chip part is sucked to a set nozzle for mounting the same;

FIG. 7A is a plan view of a printed circuit board with the chip parts and other parts mounted thereon;

FIG. 7B is a view showing a first printed circuit board and a second printed circuit board;

FIG. 8 is a view showing the relation between the automatic mounting range set on the original board and the template of the chip parts mounter;

FIG. 9 is a view showing a cathode-ray tube (CRT);

FIG. 10 is a view showing an example of the original board with areas set for obtaining a CRT circuit board;

FIG. 11 is a view showing a printed circuit board with the chip parts and other parts mounted thereon;

FIG. 12 is a view showing an example of the original board with the automatic mounting areas and the automatic mounting range set thereon, and also the relation between the automatic mounting range and the template of the chip parts mounter;

FIG. 13A is a view showing a printed circuit board with the chip parts and other parts mounted thereon;

FIG. 13B is a view showing a first printed circuit board and a second printed circuit board;

FIG. 14 is a view showing the relation between the cathode-ray tube (CRT) and the main circuit board;

FIG. 15 is a view showing an original board with areas set for obtaining the CRT circuit board thereon;

FIG. 16 is a view showing a printed circuit board with the chip parts and other parts mounted thereon; and FIG. 17 is a view showing an original board with the automatic mounting areas and the automatic mounting range set thereon.

DETAILED DESCRIPTION OF THE INVENTION

Embodiments of the present invention are explained below with reference to FIGS. 1 to 17. FIG. 1 is a plan view of an original board 5. A first printed circuit board 11 and a second printed circuit board 12 described later are fabricated from the original board 5. The first printed circuit board 11 and the second printed circuit board 12 are each used as a main circuit board of a TV receiver.

The horizontal size L1 and the vertical size L2 of the original board 5 can be determined as described below. Assume that a board constituting an original material of the original board 5 has a horizontal size of 1000 mm and a vertical size of 1000 mm. The horizontal size L1 of the original board 5 can be set to 330 mm, and the vertical size L2 thereof to 250 mm.

As a result, substantially all the parts of the board constituting the original material of the original board 5 can be utilized and waste parts amount can be decreased. Thus, the yield of the original material is improved and the cost suppressed.

A first area R1 and a second area R2 are assigned to the original board 5. The first area R1 is assigned for use as the base board of the first printed circuit board 11, and the second area R2 for use as a base board of the second printed circuit board 12. The areas R1 and R2 are assigned symmetrically about the line AX1 of the original board 5.

Also, an automatic mounting range 3 is set in the original board 5. The automatic mounting range 3 is set as a range where chip parts can be mounted by a chip parts mounter on the original board 5.

The automatic mounting range 3 is set as an area within a predetermined range of the original board 5. The automatic mounting range 3, as shown in FIG. 1, is set over the area R1 and the area R2 of the original board 5 on both sides of the line AX1 of symmetry.

The automatic mounting range 3 is set in such a manner that the horizontal size L5 and the vertical size L6 thereof correspond to a template 74 of the chip parts mounter 70 described later.

In the automatic mounting range 3, a first automatic mounting area 1 and a second automatic mounting area 2 are set. The first automatic mounting area 1 is set as a part of the area R1; and the second automatic mounting area 2 as a part of the area R2.

The first automatic mounting area 1 is where the chip parts are mounted on the first printed circuit board 11. The second automatic mounting area 2 is where the chip parts are mounted on the second printed circuit board 12.

The first automatic mounting area 1 and the second automatic mounting area 2 are set symmetrically about the center C of the original board 5. In other words, when the area R2 is rotated by 180 degrees about the center C, the second automatic mounting area 2 comes to coincide with the first automatic mounting area 1.

The steps of setting the automatic mounting areas 1 and 2 and the automatic mounting range 3 are an example of a mounting range setting step. In the mounting range setting step described above, a CAD software for designing a printed board can be used.

An image of the original board 5 is displayed on a display unit using the CAD software, and based on the image of the original board 5 thus displayed, the automatic mounting areas 1 and 2 and the automatic mounting range 3 are set thereby to produce data for setting the automatic mounting areas 1 and 2 and the automatic mounting range 3 on the original board 5. Based on the data of the automatic mounting areas 1 and 2 and the automatic mounting range 3 thus produced, the chip parts can be mounted in the subsequent steps.

Designing a board by using the CAD software is well known. The steps of designing a board by using the CAD software generally include the step of inputting the profile of the original board, the step of selecting the parts to be arranged on the board and arranging the same parts selected, and the step of arranging a wiring pattern on the board.

In these steps, the outline dimensions of the configuration formed on the printed wiring board and the range in which the parts are to be mounted on the printed wiring board are determined taking into consideration the specification and the performance of the device for mounting the parts on the board in addition to the structure of the products for which the completed printed circuit board is used and the number, type and the shape of the parts used.

The use of this well-known CAD software makes it possible to produce the data for setting the automatic mounting areas 1 and 2 and the automatic mounting range 3 on the original board 5. The data for setting an area in which a wiring pattern is formed and an area in which other parts than the chip parts are arranged on the original board 5 are also produced.

Based on the data produced by using this CAD software, the step of actually forming a wiring pattern and the step of mounting the chip parts on the board can be executed, as described below.

In the automatic mounting step described below, the automatic mounting areas 1 and 2 and the automatic mounting range 3 are determined to mount the chip parts preferentially within a range where the chip parts can be mounted by a chip parts mounter.

Next, a predetermined wiring pattern (not shown) to be formed on the first printed circuit board 11 and the second printed circuit board 12 is formed on the first automatic mounting area 1 and the second automatic mounting area 2 set as above and other predetermined areas. Specifically, a predetermined wiring pattern to be formed on the main circuit board of the TV receiver is formed.

FIG. 2 is a plan view of a printed board (printed wiring board) 10 after forming the wiring pattern on the original board 5. The printed board 10 is formed with a wiring pattern not specifically shown in FIG. 2. In forming the wiring pattern, a well-known method of forming the wiring pattern can be employed. An example of the method of forming a wiring pattern is described below.

A conductive layer of a copper foil formed on a base board is formed with a resist pattern by exposure and development. The portions of the conductive layer free of the resist pattern are etched off thereby to form a wiring pattern.

Next, the chip parts are mounted in the first automatic mounting area 1 and the second automatic mounting area 2 of the printed board 10. The chip parts are mounted automatically by the chip parts mounter.

A multiple-type chip parts mounter can be used as the chip parts mounter. The chip parts mounter based on the multiple method can pick up and mount a number of chip parts on the board at a time. FIG. 3 is a perspective view showing a multi-mounter 70 as an example of the chip parts mounter based on the multiple method.

The chip parts can be mounted by the multi-mounter 70 of FIG. 3 in the areas 1 and 2 of the printed board 10 arranged under the multi-mounter 70. The multi-mounter 70 includes a supply hopper 71, a second distributor 72 having a plurality of supply tubes 76, a distributor 73 having a plurality of distribution tubes 77, a metal template 74 and a suction head 75 having a set nozzle 78.

The chip parts to be mounted in the automatic mounting areas 1 and 2 of the printed board 10 are charged into the supply hopper 71. Once all the chip parts to be mounted in the first automatic mounting area 1 and the second automatic mounting area 2 are charged into the supply hopper 71, each of the chip parts thus charged is distributed to a predetermined supply tube in accordance with the arrangement data for determining the positions at which the chip parts are to be arranged on the metal template 74.

The arrangement data are set in accordance with the positions where the chip parts are to be arranged in the first automatic mounting area 1 to be formed on the first printed circuit board 11 and the positions where the chip parts are to be arranged in the second automatic mounting area 2 to be formed on the second printed circuit board 12.

Each of the chip parts charged into the supply hopper 71 is passed through the supply tubes 76 and the distribution tubes 77, and as shown in FIG. 4, led to an accommodation hole 74a on the metal template 74. As shown in FIG. 5, a chip part T is accommodated in the accommodation hole 74a of the metal template 74.

Next, as shown in FIG. 6A, the chip part T is sucked to a set nozzle 78, and as shown in FIG. 6B, the center of the chip part T is corrected and set in position.

In a step not shown, the chip parts are mounted at predetermined positions of the first automatic mounting area 1 and the second automatic mounting area 2 of the printed board 10 in accordance with the sequential arrangement data described above.

This step of mounting the chip parts in the automatic mounting areas 1 and 2 by the chip parts mounter 70 described above represents an example of the automatic mounting step.

Next, other parts required to make up the main circuit board of the TV receiver are mounted on the printed board 10. A printed circuit board with other parts mounted thereon is shown in FIG. 7.

FIG. 7A is a plan view of an original printed circuit board 15 having mounted thereon the chip parts and other parts. In FIG. 7A, reference numerals 6, 6 denotes tuners for selecting the receiving frequency of the TV receiver, reference numerals 7, 7 denote FBTs (flyback transformers), reference numerals 8, 8 denote jacks used for inputting/outputting signals, and reference numerals 9, 9 denote switches for turning on/off power.

By cutting the original printed circuit board 15 along the line AX1 of symmetry, the first printed circuit board 11 and the second printed circuit board 12 are obtained as shown in FIG. 7B.

Incidentally, in fabricating the printed circuit boards 11 and 12 from the original board 5 described above, the well-known steps not described above for fabricating the printed circuit board are executed appropriately. After forming the wiring pattern, for example, the step of forming holes to mount the parts on the printed wiring board and the step of forming the profile of the board are executed.

According to the method described above, the chip parts can be mounted efficiently in a short time so that the first printed circuit board 11 and the second printed circuit board 12 are efficiently formed, as explained below.

Specifically, the range in which the chip parts are mounted on the first printed circuit board 11 and the second printed circuit board 12 is set as an automatic mounting range 3 on the original board 5 shown in FIG. 1.

The automatic mounting range 3, as shown in FIG. 8, is set in such a manner as to correspond to the range in which the chip parts are arranged by a metal template 74 of the multi-mounter 70. In other words, as shown in FIG. 8, the automatic mounting range 3 is set within such a range that the chip parts are arranged by the metal template 74.

As a result, all the chip parts to be mounted in the first automatic mounting area 1 and the second automatic mounting area 2 can be set in position by the single template 74 and collectively mounted in the areas 1 and 2.

Also, mounting the chip parts for forming the two printed circuit boards including the first printed circuit board 11 and the second printed circuit board 12 is completed by a single mount operating session of the multi-mounter 70.

Further, the chip parts are mounted efficiently in a short time and the printed circuit board is efficiently fabricated. Thus, the fabrication cost of the printed circuit board is reduced.

According to the method described above, the range in which the chip parts can be mounted by the metal template 74 of the multi-mounter 70 is smaller than the size of the original board 5 as shown in FIG. 8.

As described above, the use of the compact chip parts mounter that can mount the chip parts only in a range smaller than the size of the original board 5 can reduce the installation cost of the chip parts mounter. Thus, the fabrication cost of the printed circuit board can also be reduced.

The parts other than the chip parts such as discrete parts may be arranged within the automatic mounting range 3 described above. Specifically, the automatic mounting range 3 can be set in such a manner that the chip parts mounter 70 can mount the chip parts at predetermined positions in the first automatic mounting area 1 and the second automatic mounting area 2.

Although the chip parts are not mounted in other than the automatic mounting range 3, the parts other than the chip parts may be arranged in the area of the automatic mounting range 3 where the chip parts are not mounted.

The foregoing description refers to an example of fabricating the main circuit board of the TV receiver from the original board 5. Nevertheless, a CRT circuit board, in addition to the main circuit board, may be obtained from the original board 5. FIG. 9 shows a cathode-ray tube (CRT) 38 of the TV receiver having a CRT circuit board S1.

The CRT circuit board S1 is arranged on the back of the cathode-ray tube 38 as shown in FIG. 9, and formed to a size smaller than the main circuit board. Various signals are input to and output from the cathode-ray tube 38 through the CRT circuit board S1.

An example of the step of obtaining the CRT circuit board in addition to the main circuit board from the original board 5 is explained with reference to FIGS. 10 and 11. As shown in FIG. 10, the first automatic mounting area 1, the second automatic mounting area 2 and the automatic mounting range 3 are set on the original board 5.

A first CRT circuit board area 16a and a second CRT circuit board area 17a for making up a base board of the CRT circuit board are set. The first CRT circuit board area 16a is set in the area R1, and the second CRT circuit board area 17a in the area R2. The first CRT circuit board area 16a and the second CRT circuit board area 17a are set in an area where the parts for forming the main circuit board of the original board 5 are not arranged.

A first CRT circuit board mounting area 16b is set in the first CRT circuit board area 16a, and a second CRT circuit board mounting area 17b in the second CRT circuit board area 17a.

The first CRT circuit board mounting area 16b is where the chip parts are mounted in the first CRT circuit board area 16a. The second CRT circuit board mounting area 17b, on the other hand, is where the chip parts are mounted in the second CRT circuit board area 17a.

The areas 16a and 16b are set in such a manner that the first CRT circuit board mounting area 16b is situated in the first automatic mounting area 1. Similarly, the areas 17a and 17b are set in such a manner that the second CRT circuit board mounting area 17b is situated in the second automatic mounting area 2.

An original printed circuit board for producing the main circuit board and the CRT circuit board is formed from the original board 5 having set therein the mounting areas 1, 2, 16b and 17b. The original printed circuit board can be formed in the manner described below.

A wiring pattern for the main circuit board and a wiring pattern for the CRT circuit board are formed on the original board 5 with the areas 1, 2, 16a, 16b, 17a and 17b set therein.

The chip parts are mounted in the areas 1, 2, 16b and 17b by the chip parts mounter. In the step of mounting the chip parts, the chip parts for forming on the main circuit board and the chip parts for forming on the CRT circuit board are collectively mounted within the automatic mounting range 3 by the chip parts mounter.

The parts other than the chip parts such as discrete parts for forming on the main circuit board and the CRT circuit board are also arranged. A CRT socket for connecting the CRT is also arranged in the areas 16a and 17a.

FIG. 11 is a plan view showing the state formed on the original printed circuit board. As shown in FIG. 11, the CRT circuit boards 16 and 17 can be obtained by removing the portions where the areas 16a and 17a are set.

Before removing the portions where the areas 16a and 17a are set, a perforation is formed in the boundary of the areas 16a and 17a of the original board 5. The portion of the areas 16a and 17a can thus be removed by pushing through the perforation with a finger.

In the printed circuit board shown in FIG. 11, the portions corresponding to the CRT circuit boards 16 and 17 are removed, so that the main circuit board can be obtained from the remaining portion. This remaining portion is cut along the line AX1 of symmetry thereby to produce the two main circuit boards.

In the steps described above, the chip parts to form the main circuit board and the CRT circuit board can be mounted collectively by the chip parts mounter. As a result, the chip parts can be mounted efficiently to form the main circuit board and the CRT circuit board in a short time, thereby making it possible to fabricate the main circuit board and the CRT circuit board efficiently.

Next, another example of a method of forming the printed circuit board is explained with reference to FIGS. 12 and 13. FIG. 12 is a plan view of an original board 20 with an automatic mounting areas 21, 22 and an automatic mounting range 23 set therein.

A first area R11 and a second area R12 are assigned to the original board 20. The first area R11 is assigned for use as a base board of a printed circuit board 31, and the second area R12 for use as a base board of a printed circuit board 32. These two printed circuit boards 31 and 32 are each used as a main circuit board of the TV receiver.

The original board 20 can be formed in such a manner that the horizontal size L1 and the vertical size L2 thereof are equal to the size of the original board 5. The areas R11 and R12 are assigned symmetrically about the line AX2 of symmetry.

The automatic mounting range 23 is set on the original board 20. The automatic mounting range 23 is set as an area within a predetermined range of the original board 20. The automatic mounting range 23 is set over the areas R11 and R12 of the original board 20 on both sides of the line AX2, as shown in FIG. 12.

The first automatic mounting area 21 and the second automatic mounting area 22 are set in the automatic mounting range 23. The first automatic mounting area 21 is set in a partial area within the area R11, and the second automatic mounting area 22 in a partial area within the area R12.

The first automatic mounting area 21 and the second automatic mounting area 22 are set symmetrically about the center C of the original board 20. Specifically, in the case where the area R12 is rotated by 180 degrees around the center C, the second automatic mounting area 22 comes to coincide with the first automatic mounting area 21.

As shown in FIG. 12, the horizontal size L5 and the vertical size L6 of the automatic mounting range 23 are set so that the chip parts can be arranged by the template 74 of the chip parts mounter 70.

After setting the first automatic mounting area 21 and the second automatic mounting area 22 and the automatic mounting range 23 on the original board 20, a predetermined wiring pattern is formed in the areas 21 and 22.

The chip parts are mounted by the multi-mounter 70 in each of the first automatic mounting area 21 and the second automatic mounting area 22. By mounting other parts than the chip parts, an original printed circuit board 25 is formed as shown in FIG. 13A. In FIG. 13A, reference numeral 6 denotes tuners, reference numeral 7 denotes flyback transformers, reference numeral 8 denotes jacks and reference numeral 9 denotes switches.

By cutting the original printed circuit board 25 along the line AX2 of symmetry, the first printed circuit board 31 and the second printed circuit board 32 can be produced as shown in FIG. 13B.

As explained above, the first printed circuit board 31 and the second printed circuit board 32 are formed in such a manner as to set the automatic mounting range 23 for carrying out the work of mounting the chip parts in the first automatic mounting area 21 and the second automatic mounting area 22. In this way, the automatic mounting range 23 is set in such a manner as to be included in the range of the metal template 74.

As a result, the chip parts can be mounted on each of the first automatic mounting area 21 and the second automatic mounting area 22 completely by one mount operating of the multi-mounter 70. Thus, the chip parts can be mounted efficiently within a short time, thereby making it possible to form the first printed circuit board 31 and the second printed circuit board 32 efficiently.

Also, the first printed circuit board 31 and the second printed circuit board 32 each have a wide front portion where each of the jacks 8 is arranged. Thus, the right and left positions of each switch or each jack can be changed freely to some degree thereby easily matched to the front cabinet design.

Even in the case where the conventional front cabinet is used, a base board can be set in position with the switches and the jacks of the cabinet. Thus, the cabinet is not required to be corrected and no correcting cost accrues.

Also, the first printed circuit board 31 and the second printed circuit board 32 have so wide a front portion, as described above, that the range where the chip parts are mounted can be shifted to the front side relatively.

In the range where the chip parts are mounted, the parts of low-voltage circuits are mounted but no large parts. Therefore, low parts can be concentrated on the front side. As a result, the printed circuit boards 31 and 32 can be arranged under the cathode-ray tube (CRT) where the height of the parts to be mounted is limited.

Specifically, as shown in FIG. 14, the height of the parts under a cathode-ray tube 38 is required to be lower than the level indicated by the chain line 39 due to the three-dimensional shape of the cathode-ray tube 38. The printed circuit boards 31 and 32 meet the height limitation under the cathode-ray tube 38 by concentrating the low parts thereof on the front side.

Also, the CRT circuit board in addition to the main circuit board can be obtained from the original board 20 described above. FIG. 15 is a plan view of the original board 20 with areas set to form CRT circuit boards.

As shown in FIG. 15, the first automatic mounting area 21, the second automatic mounting area 22 and the automatic mounting range 23 are set on the original printed board 20. A first CRT circuit board area 26a and a second CRT circuit board area 27a to constitute the base board of the CRT circuit board are also set.

The first CRT circuit board area 26a is set in the area R11, and the second CRT circuit board area 27a in the area R22. The first CRT circuit board area 26a and the second CRT circuit board area 27a are set where the parts for forming on the main circuit board of the original board 20 are not arranged.

The first CRT circuit board mounting area 26b is set in the first CRT circuit board area 26a, and the second CRT circuit board mounting area 27b in the second CRT circuit board area 27a.

The first CRT circuit board mounting area 26b is where the chip parts are mounted in the first CRT circuit board area 26a. The second CRT circuit board mounting area 27b is where the chip parts are mounted in the second CRT circuit board area 27a.

The areas 26a and 26b are set in such a manner that the first CRT circuit board mounting area 26b is located in the first automatic mounting area 21. Also, the areas 27a and 27b are set in such a manner that the second CRT circuit board mounting area 27b is located in the second automatic mounting area 22.

An original printed circuit board for producing the main circuit board and the CRT circuit board is formed of the original board 20 on which the mounting areas 21, 22, 26b and 27b are set. The original printed circuit board can be formed in the manner described below.

A wiring pattern to constitute the main circuit board and a wiring pattern to constitute the CRT circuit board are formed on the original board 20 with the areas 21, 22, 26a, 26b, 27a and 27b set thereon.

The chip parts are mounted by the chip parts mounter described above in the areas 21, 22, 26b and 27b. In the step of mounting the chip parts, the chip parts for forming the main circuit board and the chip parts for forming the CRT circuit board are mounted collectively in the automatic mounting range 23 by the chip parts mounter.

The parts such as discrete parts other than the chip parts to form the main circuit board and the CRT circuit board are also set. A CRT socket for connecting the CRT is also arranged in each of the areas 26a and 27a.

FIG. 16 is a plan view showing the state formed on the original printed circuit board 35. As shown in FIG. 16, the CRT circuit boards 26 and 27 can be obtained by removing the portions where the areas 26a and 27a are set.

Before removing the portions where the areas 26a and 27a are set, a perforation is formed in the boundary between the areas 26a and 27a of the original board 20. The particular portions can thus be removed by pushing through with a finger.

Also, the main circuit board can be obtained from the portion remaining after removing the portion of the printed circuit board 35 shown in FIG. 16 corresponding to the CRT circuit boards 26 and 27. By cutting the particular remaining portion along the line AX2 of symmetry, two main circuit boards are obtained.

In the steps described above, the chip parts to form the main circuit board and the CRT circuit board can be collectively mounted by the chip parts mounter. As a result, the chip parts to form the main circuit board and the CRT circuit board can be efficiently mounted within a short time, thereby making it possible to fabricate the main circuit board and the CRT circuit board efficiently.

The foregoing description refers to an example in which the printed circuit board used for the main circuit board of the TV receiver is fabricated. In embodying the invention, however, the applications of the printed circuit board are not specifically limited.

Also, in the foregoing description, an example is cited in which two areas are assigned to a single original board symmetrically about a symmetry line from which a plurality of boards are obtainable to fabricate two equal printed circuit boards. In embodying this invention, however, the number of the printed boards obtained from one original board is neither limited to two nor necessarily identical.

An example in which a different number of printed circuit boards are produced from an original board is explained with reference to FIG. 17. FIG. 17 is a view showing an original board having set therein an automatic mounting area and an automatic mounting range.

As shown in FIG. 17, four areas R21, R22, R23 and R24 divided by crossing boundary lines AX3 and AX4 are assigned to the original board 50. These four areas are each used as a base board of a printed circuit board.

One automatic mounting range 55 is set in the original board 50. The automatic mounting range 55 is set over the areas R21, R22, R23 and R24 on both sides of the boundary lines AX3 and AX4.

A first automatic mounting area 51, a second automatic mounting area 52, a third automatic mounting area 53 and a fourth automatic mounting area 54 are set in the automatic mounting range 55. The first automatic mounting area 51 is set as a part of the area R21, the second automatic mounting area 52 as a part of the area R22, the third automatic mounting area 53 as a part of the area R23, and the fourth automatic mounting area 54 as a part of the area R24.

The automatic mounting range 55 is set in such a manner that the horizontal size L5 and the vertical size L6 thereof correspond to the metal template 74 of the multi-mounter described above.

In the foregoing description, preferably, the metal template 74 of the multi-mounter 70 for mounting the chip parts is such that the chip parts can be arranged in a range having the horizontal size of 200 mm or more, 250 mm or less, and the vertical size crossing the horizontal size of 200 mm or more, 250 mm or less.

As long as the multi-mounter 70 can arrange the chip parts within the aforementioned range, a majority of the printed circuit boards used with various home electric appliances such as the TV receiver, radio and video tape recorders can be formed by the method described above.

The multi-mounter 70 having the template 74 capable of arranging the chip parts in the dimensional range described above is widely used and available at low cost, thereby reducing the cost of fabricating the printed circuit board.

The foregoing description refers to an example in which the chip parts are mounted in the automatic mounting area by the chip parts mounter. In embodying the invention, however, the surface mount parts other than the chip parts can be mounted in the automatic mounting area by the chip parts mounter with equal effect.

Specifically, in exploiting the invention, the surface mount parts constituting electronic parts including an integrated circuit (IC) other than the chip parts can be mounted on one side of the printed board.

In the case where the surface mount parts other than the chip parts are mounted, for example, can be used. In the case where the chip parts mounter of one-by-one type, the automatic mounting range is set in the range where the surface mount parts can be mounted by a sucking nozzle unit having a sucking nozzle for sucking the parts.

By limiting the range in which the surface mount parts are arranged to the automatic mounting range in this way, the range in which the sucking nozzle unit moves is limited to the automatic mounting range. Therefore, the mounting work can be carried out in a short time for an improved production efficiency.

It will thus be understood from the foregoing description that according to this invention, the surface mount parts to form a plurality of printed circuit boards in a single board can be efficiently mounted by the chip parts mounter. As a result, a plurality of printed circuit boards can be efficiently fabricated from a single board, and thus the cost of the printed circuit board is reduced.

What is claimed is:

1. A method of fabricating a printed circuit board, comprising:

a mounting range setting step wherein a plurality of areas each used as a base board of a printed circuit board are assigned to a single original board from which a plurality of printed circuit boards are obtainable, an automatic mounting area is set in each of the plurality of areas for a chip parts mounter to mount surface mount parts for forming a printed circuit board corresponding to each of the plurality of areas assigned for the base board of each of the printed circuit boards, and an automatic mounting range is set in a range covering all the automatic mounting areas in each area of the plurality of areas where the base board of each of the printed circuit boards is assigned;

wherein the mounting range setting step is such that the automatic mounting range is set within a predetermined range on the single original board and within which the chip parts mounter mounts collectively by a single mounting operation the surface mount parts in a plurality of the automatic mounting areas in the plurality of areas on the single original board.

2. The method of fabricating a printed circuit board according to claim 1, wherein the surface mount parts are chip parts, wherein the chip parts mounter is of a multiple type for collectively mounting the chip parts by positioning each of the chip parts with a template of a specified size; and wherein the template of a specified size is smaller than the original board, and the automatic mounting range is set to correspond to the range of the template of a specified size.

3. The method of fabricating a printed circuit board according to claim 2, wherein the printed circuit board is formed as a main circuit board of a TV receiver, wherein in the mounting range setting step, a first area and a second area to form a base board of the main circuit board are equally assigned to the original printed board, and an automatic mounting area is set in each of the first and second areas, and wherein the first and second areas are assigned that one of the first and second areas, if rotated by 180 degrees around the center of the original board, comes to coincide with the other.

4. The method of fabricating a printed circuit board according to claim 3, wherein as the printed circuit board, including a CRT circuit board for a TV receiver, a base board of the CRT circuit board is formed to a size smaller than the base board of the main circuit board, wherein in the mounting range setting step, an area used as the base board of the CRT circuit board is set in each of that portion of the first area where the parts are not formed on the main circuit board and that portion of the second area where the parts are not formed on the main circuit board, wherein a CRT circuit board mounting area for mounting the chip parts to form the CRT circuit board is set in each of the areas used as the base board of the CRT circuit board, and wherein the automatic mounting range is set to include the two CRT circuit board mounting areas.

5. The method of fabricating a printed circuit board according to claim 1, further comprising the step of mounting the surface mount parts by the chip parts mounter in the automatic mounting range set in the mounting range setting step.

6. The method of fabricating a printed circuit board according to claim 2, further comprising the step of mounting the chip parts by the chip parts mounter of a multiple type in the automatic mounting range set in the mounting range setting step.

7. The method of fabricating a printed circuit board according to claim 3, further comprising the step of mounting the chip parts by the chip parts mounter of a multiple type in the automatic mounting range set in the mounting range setting step.

8. The method of fabricating a printed circuit board according to claim 4, further comprising the step of mounting the chip parts by the chip parts mounter of a multiple type in the automatic mounting range set in the mounting range setting step.

9. A method of fabricating a printed circuit board, comprising the steps of:

assigning on a single original board a plurality of areas each for use as a base board of a printed circuit board;

setting an automatic mounting area in each of the plurality of areas for a parts mounter to mount surface mount parts for forming a printed circuit board for each corresponding area of the plurality of areas, and setting an automatic mounting range in a range to cover each of the plurality of the automatic mounting areas where the base board of each of the printed circuit boards is assigned, wherein the automatic mounting range is set as an area within a predetermined range on the single original board and within which the parts mounter mounts collectively by a single mounting operation the surface mount parts in a plurality of the automatic mounting areas in the plurality of areas on the single original board.

10. The method of fabricating a printed circuit board according to claim 9, further comprising providing chip parts as the surface mount parts;

providing the parts mounter as a multiple type mounter for collectively mounting the chip parts by positioning each of the chip parts with a template of a specified size, wherein the template of a specified size is smaller than the original board; and setting the automatic mounting range to correspond to the range of the template of a specified size.

11. The method of fabricating a printed circuit board according to claim 10, further comprising:

forming the printed circuit board as a main circuit board of a TV receiver, and equally assigning a first area and a second area on the single original board to each form the base board of a main circuit board and setting an automatic mounting area in each of the first and second areas, wherein one of the first and second areas, when rotated by 180 degrees around the center of the original board, comes to coincide with the other of the first and second areas.

12. The method of fabricating a printed circuit board according to claim 11, further comprising assigning in each of the first and second areas a base board for a CRT circuit board for a TV receiver, the base board of the CRT circuit board being formed to a size smaller than the base board of the main circuit board, setting an area used as the base board of the CRT circuit board in each of that portion of the first area where the parts are not formed on the main circuit board and that portion of the second area where the parts are not formed on the main circuit board, setting a CRT circuit board mounting area for mounting the chip parts to form the CRT circuit board in each of the areas used as the base board of the CRT circuit board, and setting the automatic mounting range to include the CRT circuit board mounting areas.

13. The method of fabricating a printed circuit board according to claim 9, further comprising the step of mounting the surface mount parts by the parts mounter within the area in the automatic mounting range.

14. The method of fabricating a printed circuit board according to claims 10, further comprising the step of:

mounting the chip parts by the multiple type parts mounter within the area in the automatic mounting range.

15. The method of fabricating a printed circuit board according to claim 11, further comprising the step of:

mounting the chip parts by the multiple type parts mounter within the area in the automatic mounting range.

16. The method of fabricating a printed circuit board according to claim 12, further comprising the step of:

mounting the chip parts by the multiple type parts mounter within the area in the automatic mounting range.

* * * * *